United States Patent
Yen et al.

(10) Patent No.: US 9,337,181 B2
(45) Date of Patent: May 10, 2016

(54) SEMICONDUCTOR DEVICE AND METHOD OF MANUFACTURING SAME

(71) Applicant: REALTEK SEMICONDUCTOR CORPORATION, Hsinchu (TW)

(72) Inventors: Hsiao-Tsung Yen, Hsinchu (TW); Yuh-Sheng Jean, Hsinchu County (TW); Ta-Hsun Yeh, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 14/638,381

(22) Filed: Mar. 4, 2015

(65) Prior Publication Data

US 2015/0262996 A1    Sep. 17, 2015

(30) Foreign Application Priority Data

Mar. 11, 2014  (TW) .............................. 103108269 A

(51) Int. Cl.
| | |
|---|---|
| H01L 27/108 | (2006.01) |
| H01L 27/02 | (2006.01) |
| H01L 21/306 | (2006.01) |
| H01L 21/02 | (2006.01) |
| H01L 21/283 | (2006.01) |
| H01L 21/311 | (2006.01) |
| H01L 27/06 | (2006.01) |
| H01L 29/66 | (2006.01) |
| H01L 29/94 | (2006.01) |

(52) U.S. Cl.
CPC ...... *H01L 27/0288* (2013.01); *H01L 21/02107* (2013.01); *H01L 21/283* (2013.01); *H01L 21/306* (2013.01); *H01L 21/311* (2013.01); *H01L 27/0688* (2013.01); *H01L 29/66181* (2013.01); *H01L 29/945* (2013.01)

(58) Field of Classification Search
CPC ............ H01L 21/02107; H01L 21/283; H01L 21/306; H01L 21/311; H01L 27/0288
USPC .................. 257/301, 303, 304, 532, 536, 538
See application file for complete search history.

(56) References Cited

U.S. PATENT DOCUMENTS

| | | | | |
|---|---|---|---|---|
| 6,472,721 | B2 * | 10/2002 | Ma ......................... | H01L 28/60 257/531 |
| 6,566,191 | B2 * | 5/2003 | Hsu ................. | H01L 21/823462 257/E21.396 |
| 6,566,715 | B1 | 5/2003 | Ker et al. | |
| 8,399,961 | B2 | 3/2013 | Yen et al. | |
| 8,502,338 | B2 | 8/2013 | Yen et al. | |
| 2005/0280063 | A1 * | 12/2005 | Cheng .................. | H01L 29/945 257/301 |

* cited by examiner

*Primary Examiner* — Hung Vu
(74) *Attorney, Agent, or Firm* — WPAT, P.C., Intellectual Property Attorneys; Anthony King

(57) ABSTRACT

A semiconductor device includes a substrate, a first trough structure and a second trough structure. The first trough structure which is in the substrate includes a first conductive layer, a first doping layer and a first insulation layer, which is placed between the first conductive layer and the first doping layer. The second trough structure which is in the substrate and separated from the first trough structure by a separation part of the substrate includes a second conductive layer and a second insulation layer. A first contact connects the first doping layer, a second contact connects the separation part, and a third contact connects the second conductive layer. The separation part forms a resistor, coupled between the first contact and the second contact, and the substrate, the second insulation layer and the second conductive layer together form a capacitor, coupled between the second contact and the third contact.

13 Claims, 14 Drawing Sheets

SEMICONDUCTOR DEVICE AND METHOD OF MANUFACTURING SAME

BACKGROUND OF THE INVENTION

1. Field of the Invention

The present invention relates to a semiconductor device and method of manufacturing the semiconductor device, especially to a semiconductor device and the associated manufacturing method that utilize a 3D (three-dimensional) structural semiconductor device to implement an ESD (electrostatic discharge) protection circuit, so as to reduce circuit areas.

2. Description of Related Art

ESD protection is significant in the semiconductor field. In particular, when the semiconductor manufacturing process is more compact and the line width becomes thinner, the integrated circuits are exposed to higher threats of all kinds of ESDs, such as HBM (Human-Body Model) ESD, MM (Machine Model) ESD, and CDM (Charged-Device Model) ESD. Please refer to FIG. 1, illustrating a conventional ESD protection circuit. The main circuit 150 inside an IC chip uses an input pad 130 and an output pad 140 to communicate with circuits outside the IC chip. The input pad 130 and the output pad 140 are connected respectively to an ESD protection circuit 110 and an ESD protection circuit 120. The ESD protection circuit 110 is composed of a PMOS 112 and an NMOS 114, which are connected in series, and the ESD protection circuit 120 is composed of a PMOS 122 and an NMOS 124, which are connected in series. This ESD protection circuit has a disadvantage that the PMOS/NMOS occupies too much area. Another ESD protection circuit composed of diodes has the same problem.

SUMMARY OF THE INVENTION

In consideration of the imperfections of the prior art, an object of the present invention is to provide a semiconductor device and method of manufacturing the semiconductor device, so as to make an improvement to the prior art.

The present invention discloses a semiconductor device that comprises a substrate, a first trough structure, a second trough structure, a first contact, a second contact, and a third contact. The first trough structure is on the substrate and comprises a first conductive layer, a first doping layer, a doping concentration of which is higher than a doping concentration of the substrate, and a first insulation layer, formed between the first conductive layer and the first doping layer. The second trough structure, which is on the substrate and separated from the first trough structure by a separation part of the substrate, comprises a second conductive layer, a second doping layer, a doping concentration of which is higher than a doping concentration of the substrate, and a second insulation layer, formed between the second conductive layer and the second doping layer. The first contact connects the first doping layer. The second contact connects the second doping layer. The third contact connects the second conductive layer. The separation part of the substrate forms a resistor, which is coupled between the first contact and the second contact, and the second doping layer, the second insulation layer and the second conductive layer together form a capacitor, which is coupled between the second contact and the third contact.

The present invention also discloses a semiconductor device that comprises a substrate, a first trough structure, a second trough structure, a first contact, a second contact, and a third contact. The first trough structure is on the substrate and comprises a first conductive layer, a first doping layer, a doping concentration of which is higher than a doping concentration of the substrate, and a first insulation layer, formed between the first conductive layer and the first doping layer. The second trough structure, which is on the substrate and separated from the first trough structure by a separation part of the substrate, comprises a second conductive layer and a second insulation layer, which is formed between the second conductive layer and the substrate. The first contact connects the first doping layer of the first trough structure. The second contact connects the separation part of the substrate. The third contact connects the second conductive layer of the second trough structure. The separation part of the substrate forms a resistor, which is coupled between the first contact and the second contact, and the substrate, the second insulation layer and the second conductive layer together form a capacitor, which is coupled between the second contact and the third contact.

The present invention further discloses a method of manufacturing a semiconductor device, comprising: providing a substrate; forming a first trough structure on the substrate, the first trough structure comprising at least a first sidewall; forming a first doping layer on the first sidewall; covering the first doping layer and a part of a surface of the substrate by a photoresist; forming a second trough structure on a part of the substrate which is not covered by the photoresist, the second trough structure comprising at least a second sidewall; removing the photoresist; forming an insulation layer on the substrate, the first trough structure, and the second trough structure, wherein a first part of the insulation layer is in the first trough structure and covers the first doping layer, and a second part of the insulation layer is in the second trough structure; forming a conductive layer on the substrate, the first trough structure, and the second trough structure, wherein a first part of the conductive layer is in the first trough structure and covers the first insulation layer, and a second part of the conductive layer is in the second trough structure and covers the second insulation layer; and removing parts of the insulation layer and the conductive layer that are outside the first trough structure and the second trough structure to expose a surface of the first doping layer at the opening of the first trough structure.

The semiconductor device and its associated manufacturing method of the present invention utilize 3D semiconductor structure to implement the electronic devices of the ESD protection circuit, such as diodes, resistors, and capacitors. Because these electronic devices are arranged along a direction perpendicular to the surface of a substrate, the area occupied by the ESD protection circuit can be greatly reduced, which makes good use of the substrate and decreases the area of the electronic devices.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The following description is written by referring to terms of this invention field. If any term is defined in the specification, such term should be explained accordingly. Besides, the connection between objects or events in the following embodiments can be direct or indirect provided that these embodiments are still applicable under such connection. Said "indirect" means that an intermediate object or a physical space exists between the objects, or an intermediate event or a time interval exists between the events. The present invention discloses a semiconductor device and method of manufacturing the semiconductor device, and the detail known in this field will be omitted if such detail has little to do with the features of the present invention. People of ordinary skill in the art can choose components or steps equivalent to those described in this specification to carry out the present invention, which means that the scope of this invention is not limited to the embodiments in the specification. On account of that some or all elements of said device invention could be known, the detail of such elements will be omitted provided that this omission nowhere dissatisfies the specification and enablement requirements.

Figure 1:
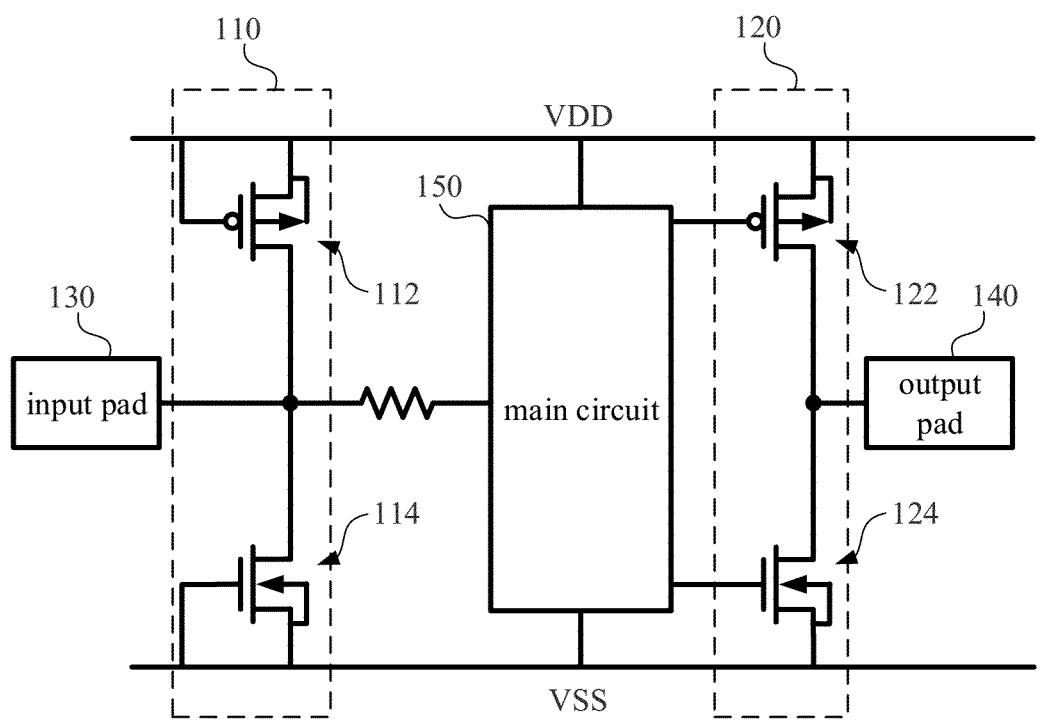
FIG. 1 illustrates a conventional ESD protection circuit.
Figure 2:
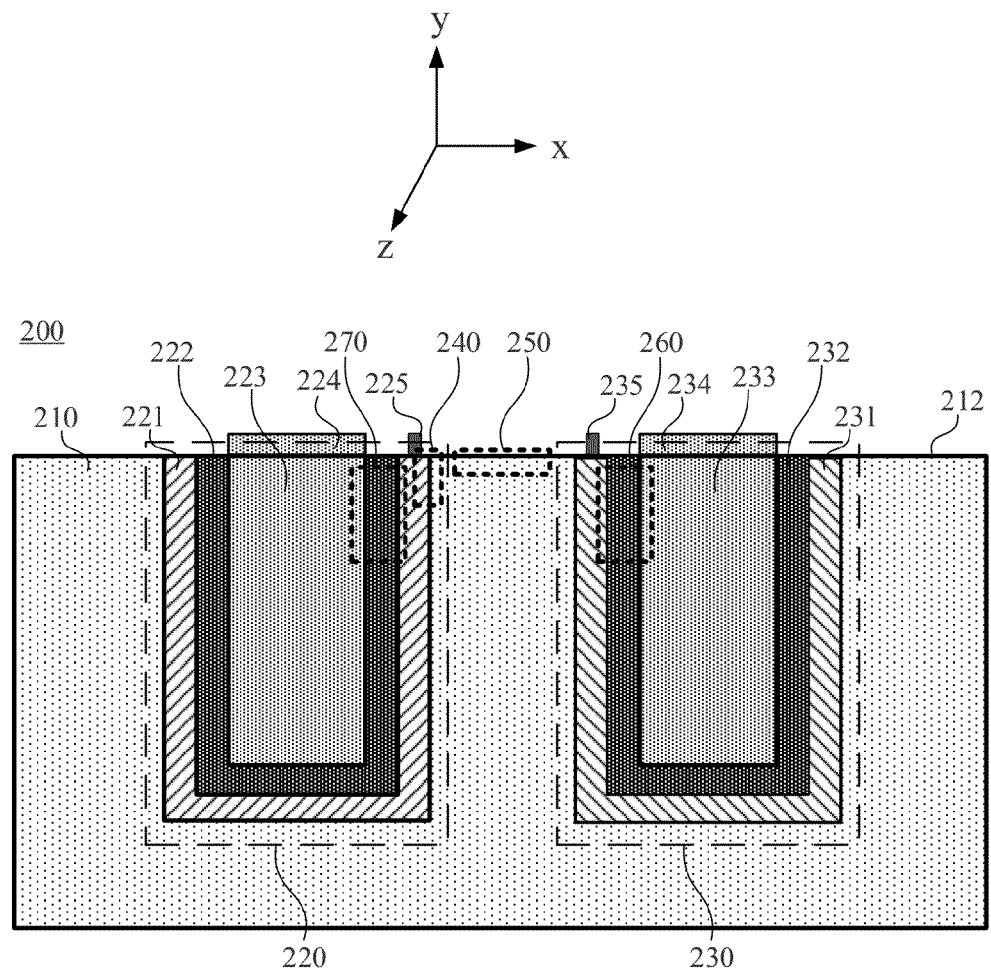
FIG. 2 illustrates a cross section of a semiconductor device according to an embodiment of the present invention.

Please refer to FIG. 2, illustrating a cross section of semiconductor devices according to an embodiment of the present invention. A semiconductor device 200 comprises a substrate 210, a trough structure 220 and a trough structure 230. The trough structure 220 and the trough structure 230 use a part of the substrate 210 as their separation, such as the area denoted by the dotted frame 250. The trough structure 220 and the trough structure 230 are spaces formed by etching the substrate 210 from the upper surface 212 of the substrate 210 along the y-direction to the bottom of the substrate 210, and can be trench structures extending along the z-direction or part of an array structure that has openings, in a circular, rectangular, or polygonal shape, on the upper surface 212. The array structure has an array of grooves distributed on the substrate 210 and the trough structure 220 and the trough structure 230 are two grooves of the array. The bottom surfaces of the trough structure 220 and the trough structure 230 are adjacent to the substrate 210; namely, the trough structure 220 and the trough structure 230 do not penetrate through the substrate 210. The trough structure 220 comprises, in an order from the substrate 210 to the center of the trough structure 220, a doping layer 221, an insulation layer 222, and a conductive layer 223, and the trough structure 230 comprises, in an order from the substrate 210 to the center of the trough structure 230, a doping layer 231, an insulation layer 232, and a conductive layer 233. The doping layer 221 and the doping layer 231 have doping concentrations higher than a doping concentration of the substrate 210, and respectively form a well structure. The insulation layer 222 and the insulation layer 232 can be made of oxides that are common in a semiconductor manufacturing process, such as silicon dioxide (SiO2), silicon nitride (Si3N4), or oxynitride, and the conductive layer 223 and the conductive layer 233 can be made of metals such as copper (Cu), tungsten (W), aluminum (Al), aluminum-copper alloy (Al—Cu), nickel (Ni), titanium nitride (TiN), and titanium (Ti). The conductive layer 223 and the conductive layer 233 utilize a contact 224 and a contact 234 respectively to connect to other components. The materials of the contact 224 and contact 234 can be the same as those of the conductive layer 223 and the conductive layer 233. On the other hand, the doping layer 221 and the doping layer 231 utilize a contact 225 and a contact 235 respectively to connect to other components. The contact 225 and the contact 235 can be a via, a via array, or a via trench. In one embodiment, the conductive layer 223 and the conductive layer 233 have thicknesses (in the x-direction) around 0.5 nm to 15 nm. Yet in another embodiment, the insulation layer 222 and the insulation layer 232 have thicknesses around 0.05 nm to 2 nm, and the doping layer 221 and the doping layer 231 have thicknesses around 0.01 nm to 5 nm. The numerical ranges above may have fluctuations due to manufacturing variations.

Figure 3:
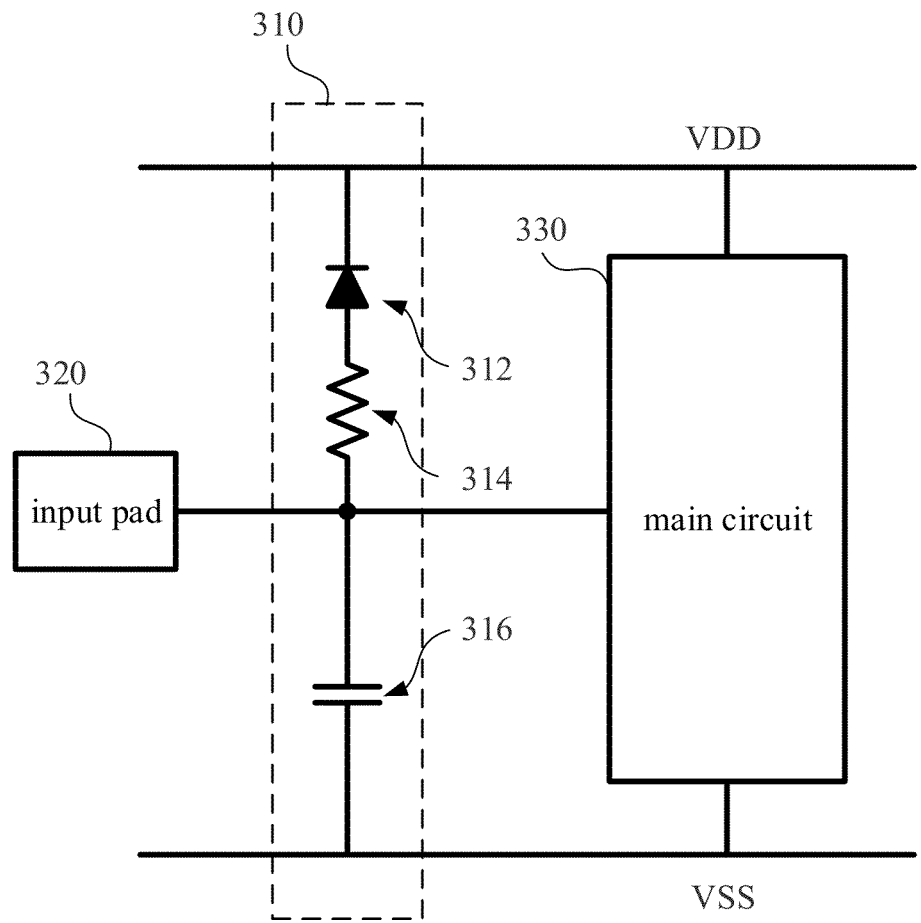
FIG. 3 illustrates an ESD protection circuit according to an embodiment of the present invention.

In a preferred embodiment, a doping type of the substrate 210 is the same as a doping type of the doping layer 231 but different from that of the doping layer 221. For example, the substrate 210 is a p-substrate, the doping layer 221 is an n-well and the doping layer 231 is a p-well, resulting in a p-n junction at the dotted frame 240, which can be used as a diode. Moreover, a part of the substrate 210 that separates the trough structure 220 and the trough structure 230 forms a resistor on the surface, as depicted by the dotted frame 250, and the resistance of the resistor can be adjusted by applying different doping concentrations to this area. Further, a capacitor is formed at the dotted frame 260, with the doping layer 231 and the conductive layer 233 being the two electrodes and the insulation layer 232 being the dielectric layer. As a result, a circuit made of a diode, a resistor and a capacitor connected in series is formed by connecting the contact 225, the contact 235, and the contact 234. This circuit can be used as an ESD protection circuit, as shown in FIG. 3. Please refer to FIG. 3, illustrating an ESD protection circuit according to an embodiment of the present invention. The main circuit 330 inside a chip receives signals via the input pad 320, which is connected to the ESD protection circuit 310. The ESD protection circuit 310 comprises a diode 312, a resistor 314, and a capacitor 316. For high frequency ESD signals, the capacitor 316 acts like a bypass, so the high frequency ESD signals flow to the voltage level VSS via the capacitor 316, without damaging the main circuit 330. The diode 312 prevents currents from flowing reversely from the voltage level VDD to the input pad 320, and the resistor 314 adjusts the magnitude of the currents on that path. Please also refer to FIG. 2. When the contact 225 is connected to the voltage level VDD, the contact 235 is connected to the input pad 320, and the contact 234 is connected to the voltage level VSS, the ESD protection circuit 310 in FIG. 3. is obtained. Since the spaces occupied by the diode 312 and the capacitor 316 in the substrate 210 mainly extend along the longitudinal direction (i.e., the y-direction in the figure) instead of the lateral direction (i.e., the x-direction in the figure) in the substrate 210, the diode 312 and the capacitor 316 occupy smaller area of the upper surface 212 compared to conventional electronic components; thus, the area of the substrate 210 can be saved.

Figure 4:
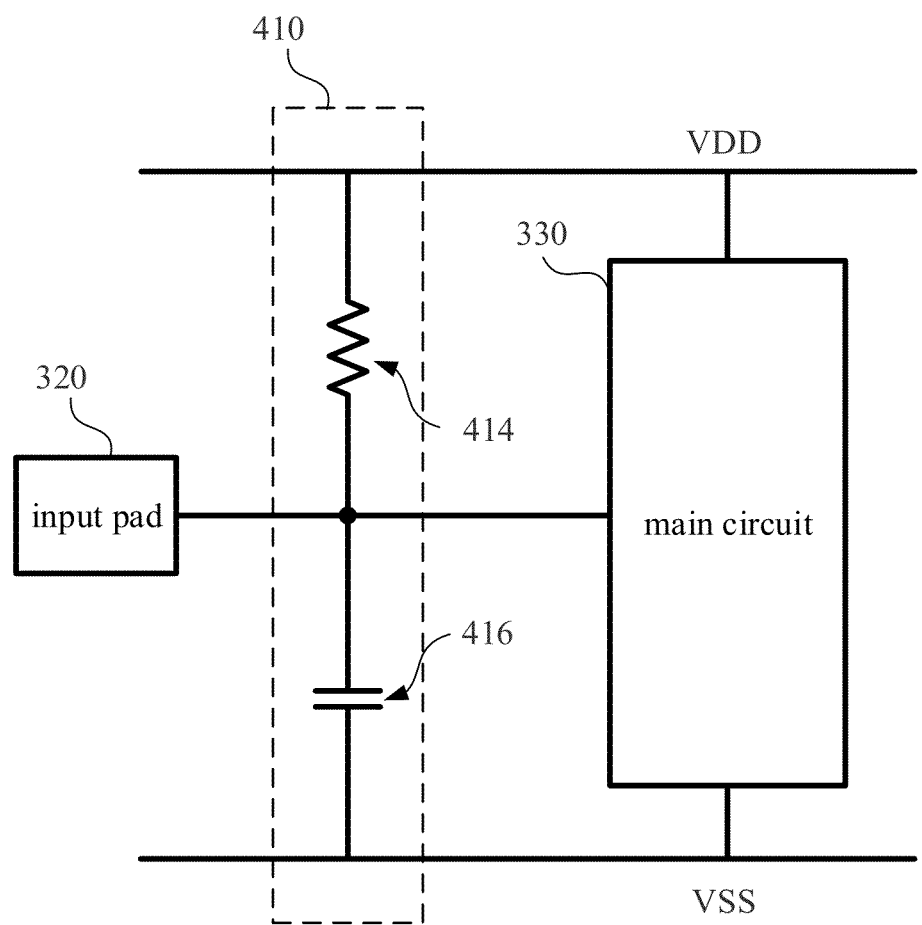
FIG. 4 illustrates an ESD protection circuit according to another embodiment of the present invention.

In another preferred embodiment, the doping types of the doping layer 221 and the doping layer 231 are the same as the doping type of the substrate 210. For example, the substrate 210 is a p-substrate, and the doping layer 221 and the doping layer 231 are both p-well; if, however, the substrate 210 is an n-substrate, the doping layer 221 and the doping layer 231 are then both n-well. In this case, the dotted frame 240 dons not contain a p-n junction anymore, but the resistor at the dotted frame 250 and the capacitor at the dotted frame 260 are still there. An ESD protection circuit that uses the semiconductor device 200 is thus shown in FIG. 4. Please refer to FIG. 4, illustrating an ESD protection circuit according to another embodiment of the present invention. The ESD protection circuit 410 comprises a resistor 414 and a capacitor 416. The resistor 414 is to regulate the current flowing on that path, and the capacitor 416 is used as a bypass for high frequency signals.

Please refer again to FIG. 2. The dotted frame 270 forms another capacitor, with the doping layer 221 and the conductive layer 223 being the two electrodes and the insulation layer 222 being the dielectric layer. In the above applications, the capacitor at the dotted frame 270 is not used, and therefore the contact 224 and the contact 225 can be connected, namely, both connected to the voltage level VDD. However, the contact 224 and the contact 225 can be connected to different voltage levels to make use of the capacitor at the dotted frame 270 when the semiconductor device 200 is used in other applications.

Figure 5:
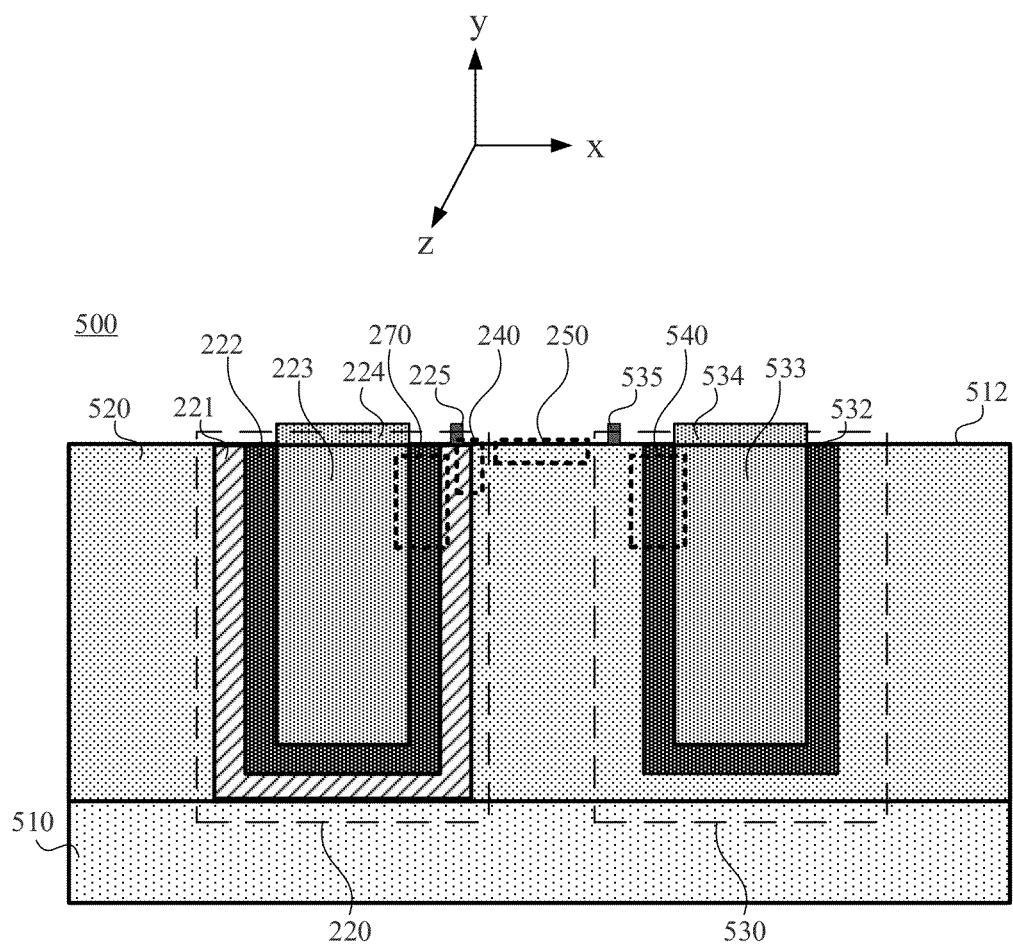
FIG. 5 illustrates a cross section of a semiconductor device according to another embodiment of the present invention.

Please refer to FIG. 5, illustrating a cross section of semiconductor devices according to another embodiment of the present invention. Compared with the embodiment in FIG. 2, the substrate 510 of the semiconductor device 500 has a doping layer 520 that is doped in advanced by a predetermined depth with a doping concentration higher than that of the substrate 510, and the trough structure 220 and the trough structure 530 are implemented in the doping layer 520. Compared with the trough structure 220, the trough structure 530 comprises an insulation layer 532 and a conductive layer 533. The contact 534, whose material can be the same as the conductive layer 533, is to connect the conductive layer 533 and external circuits, and the contact 535 connects the doping layer 520. The dotted frame 540 can still form a capacitor, with the doping layer 520 and the conductive layer 533 being the two electrodes and the insulation layer 532 being the dielectric layer. The dotted frame 250 still forms a resistor. In a preferred embodiment, the substrate 510 is a p-substrate, the doping layer 520 is a p-type doping layer with higher doping concentration, and the doping layer 221 is an n-well. As a result, a p-n junction is still formed at the dotted frame 240, and therefore the semiconductor device 500 can be applied to the ESD protection circuit 310 shown in FIG. 3. Similarly, the resistance of the resistor 314 can be adjusted by changing the doping concentration of the doping layer 520 or by changing a doping concentration in a local area between the trough structure 220 and the trough structure 530 of the doping layer 520.

Figure 6:
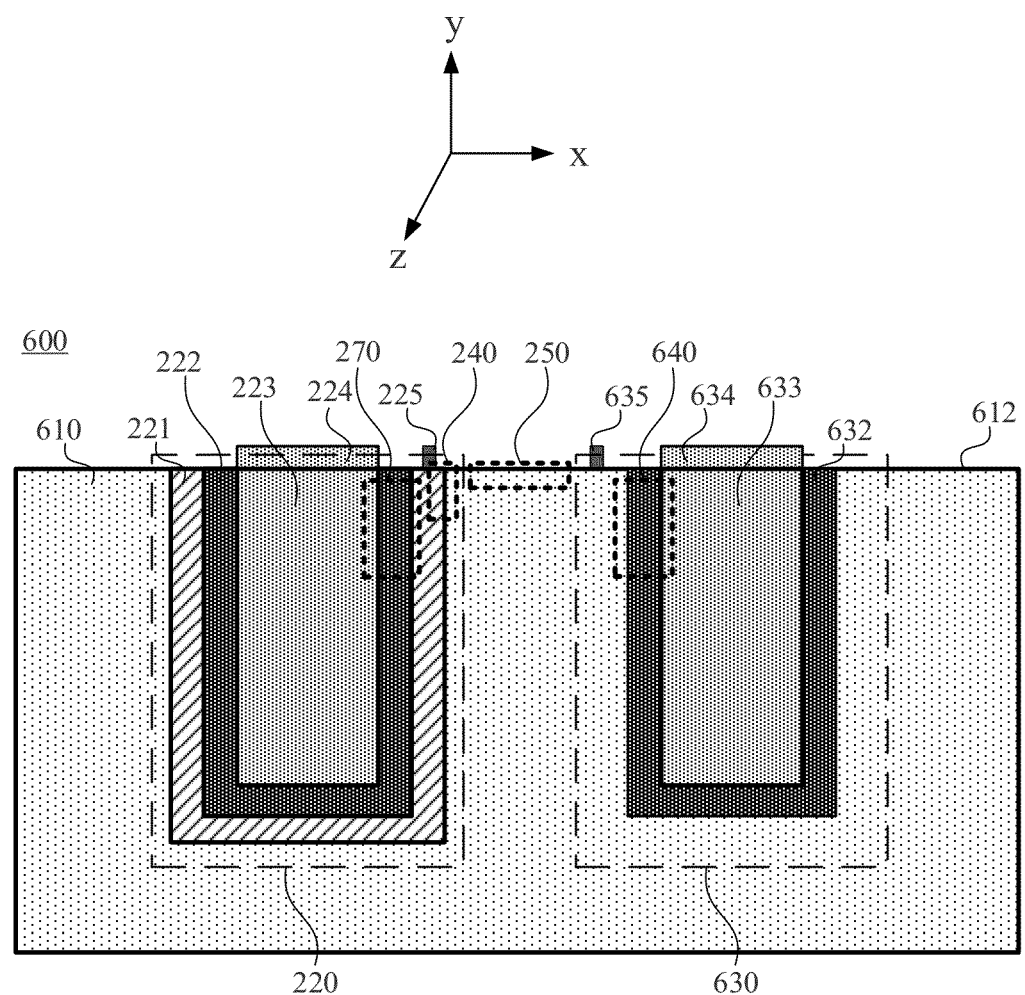
FIG. 6 illustrates a cross section of a semiconductor device according to another embodiment of the present invention.

Please refer to FIG. 6, illustrating a cross section of semiconductor devices according to another embodiment of the present invention. The trough structure 630 of the semiconductor device 600 comprises an insulation layer 632 and a conductive layer 633. The conductive layer 633 connects external circuits via the contact 634, whose material can be the same as the conductive layer 633, and the contact 635 is connected to a substrate 610. Similarly, the dotted frame 640 and the dotted frame 270 respectively comprise a capacitor. In a preferred embodiment, the substrate 610 is a p-substrate, the doping layer 221 is an n-well; namely, a p-n junction is still formed at the dotted frame 240, and therefore the semiconductor device 600 can be applied to the ESD protection circuit 310 of FIG. 3. Similarly, the resistance of the resistor 314 can be adjusted by changing the doping concentration of the substrate 610 or by changing a doping concentration in a local area between the trough structure 220 and the trough structure 630 of the substrate 610. In one embodiment, the conductive layer 533 and the conductive layer 633 have thicknesses (in the x-direction) around 0.5 μm to 15 μm. Yet in another embodiment, the insulation layer 532 and the insulation layer 632 have thicknesses around 0.05 nm to 2 nm. The numerical ranges above may have fluctuations due to manufacturing variations.

Figure 7:
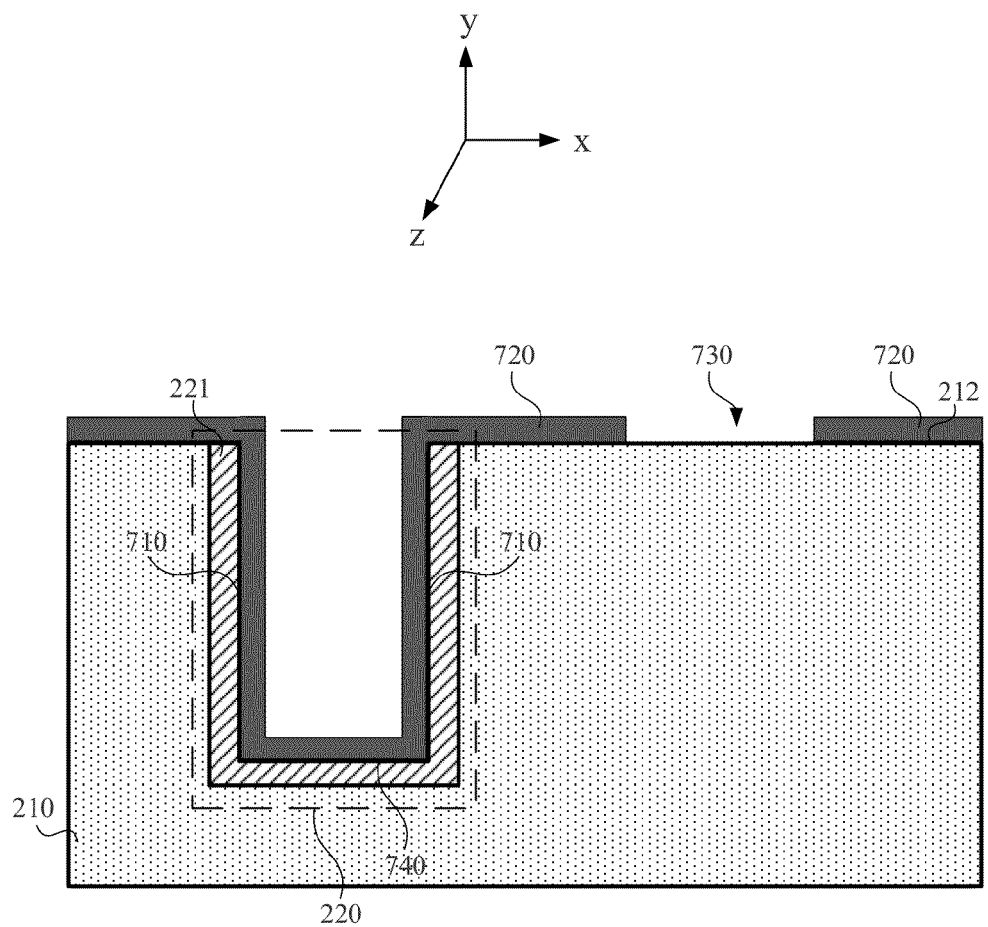
FIGS. 7~13 illustrate the manufacturing sequences of implementing the =200 of the present invention.
Figure 8:
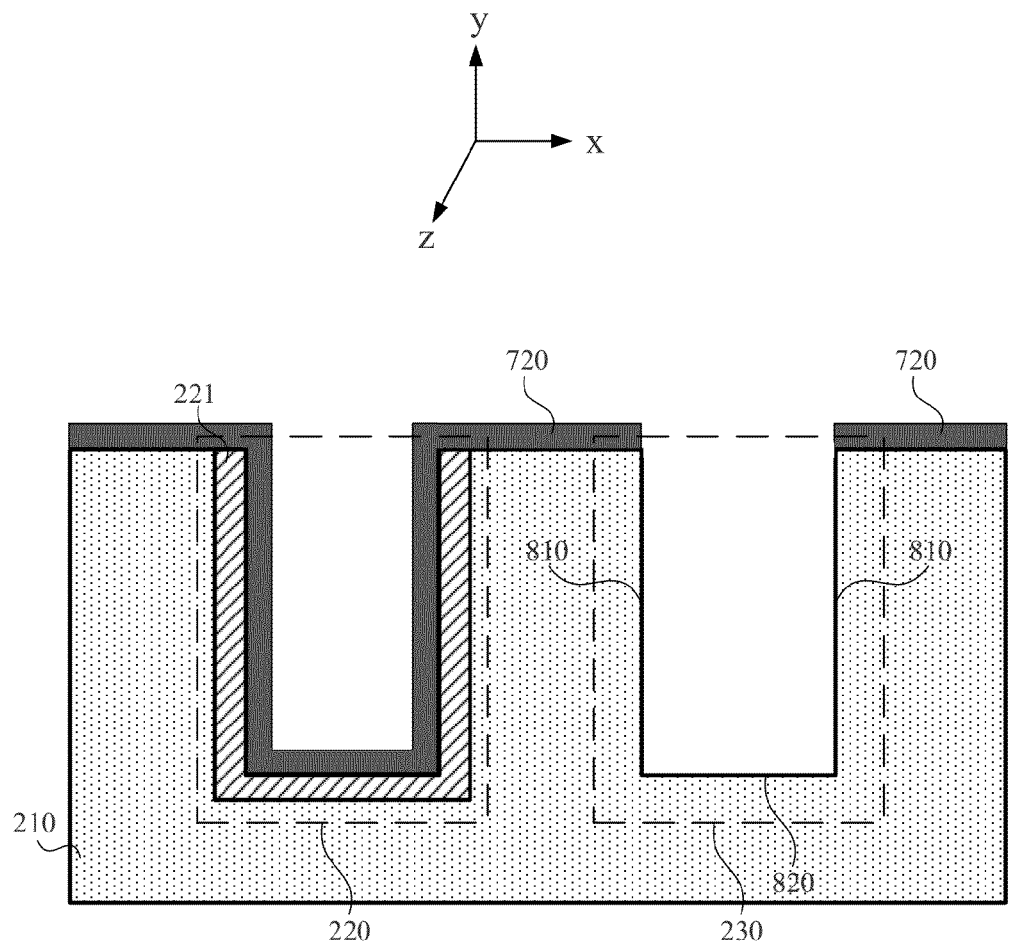
Figure 9:
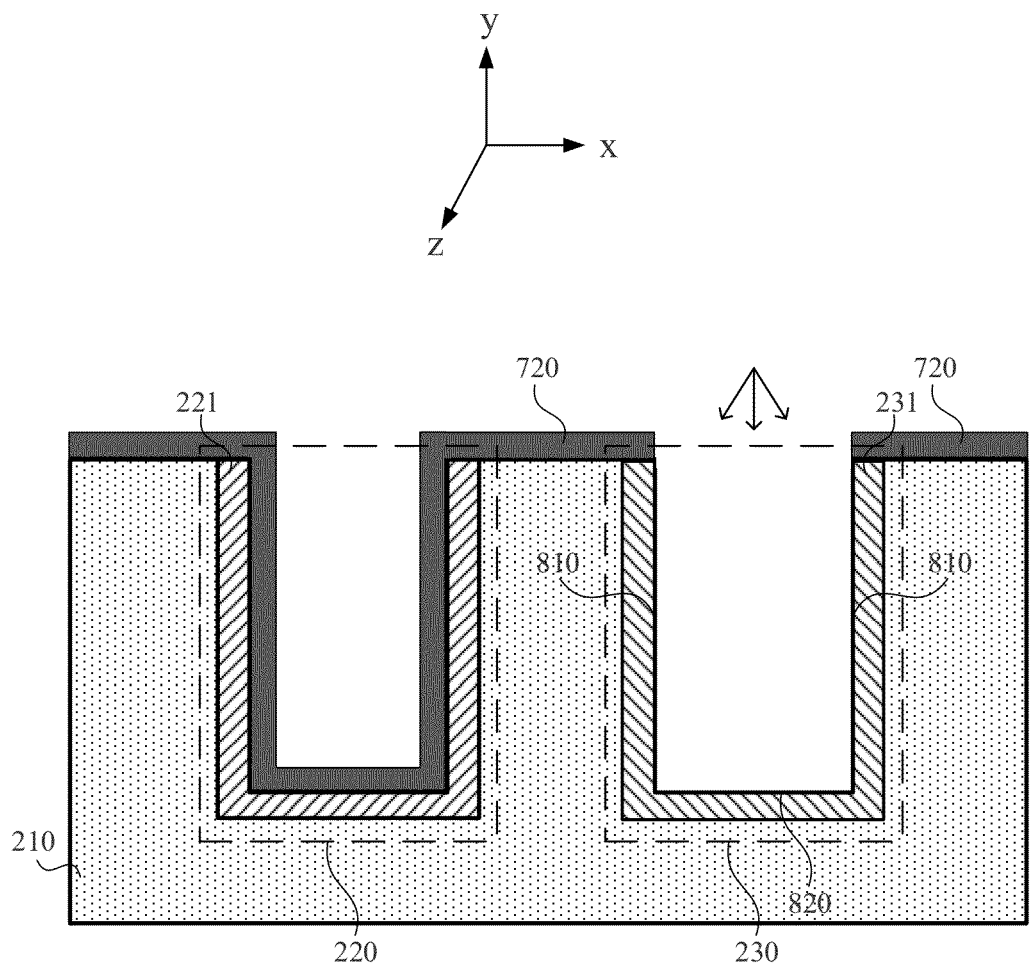
Figure 10:
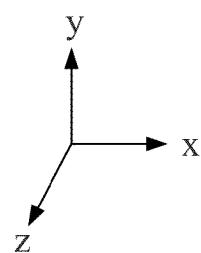
Figure 10:
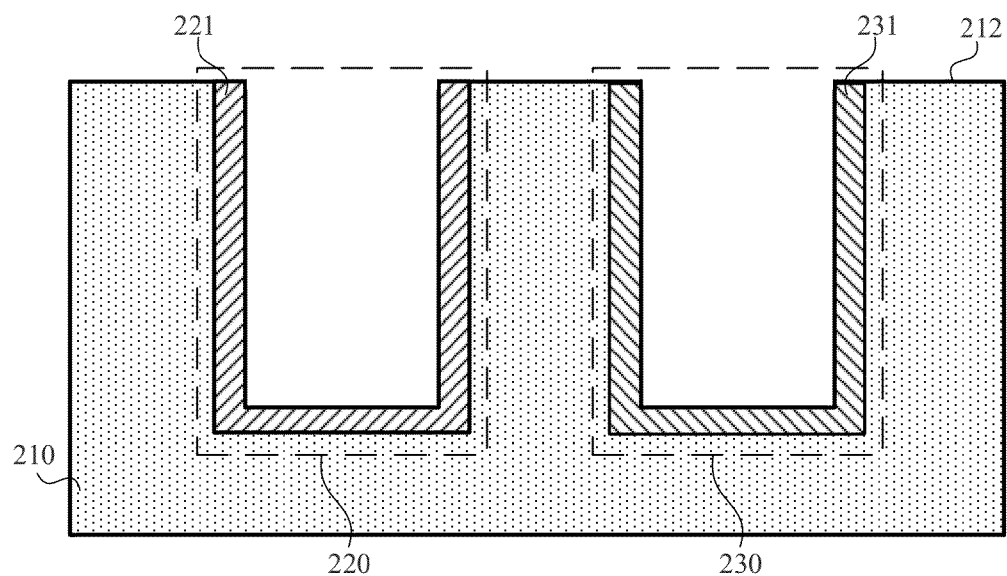
Figure 11:
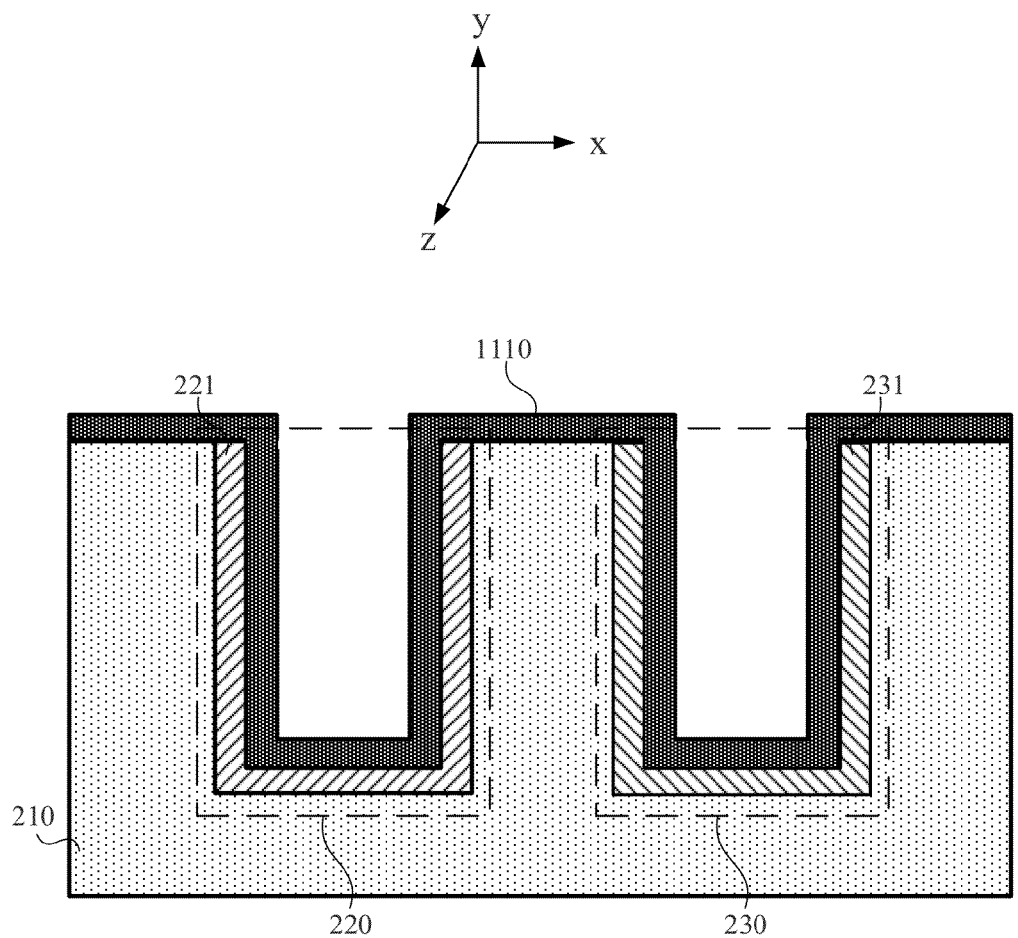
Figure 12:
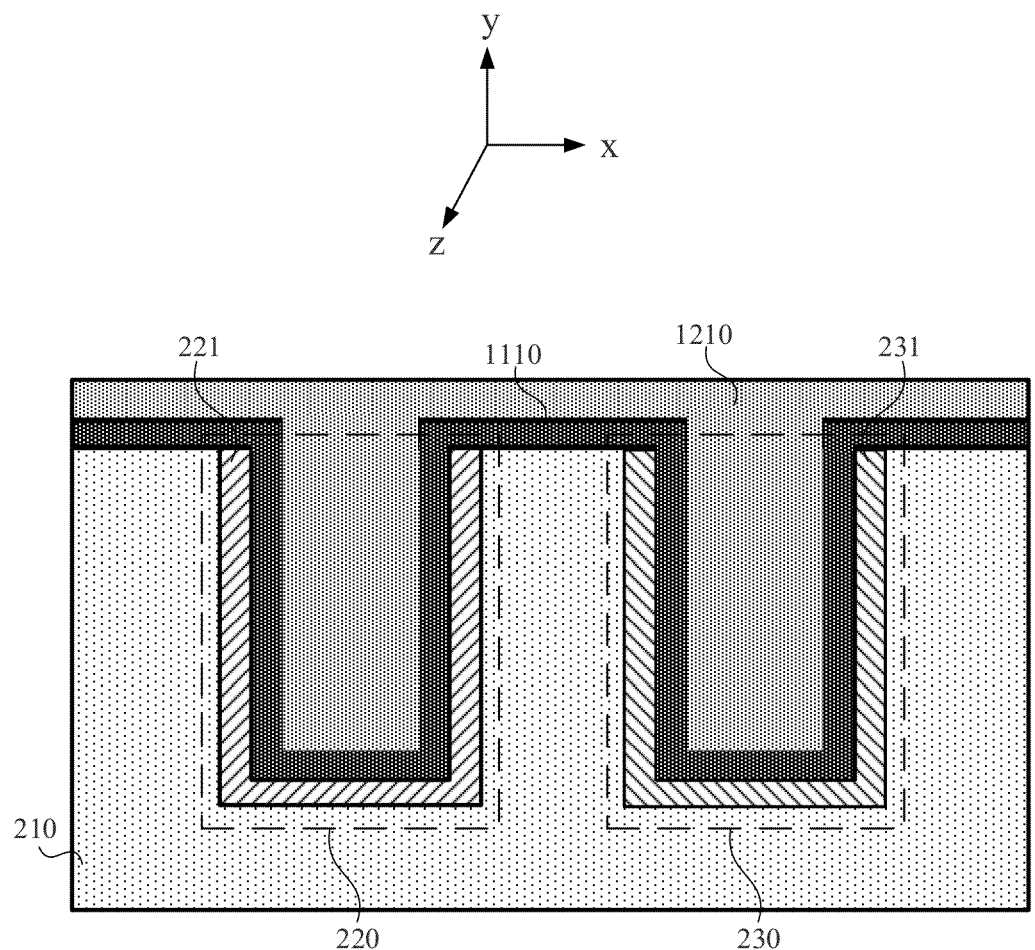
Figure 13:
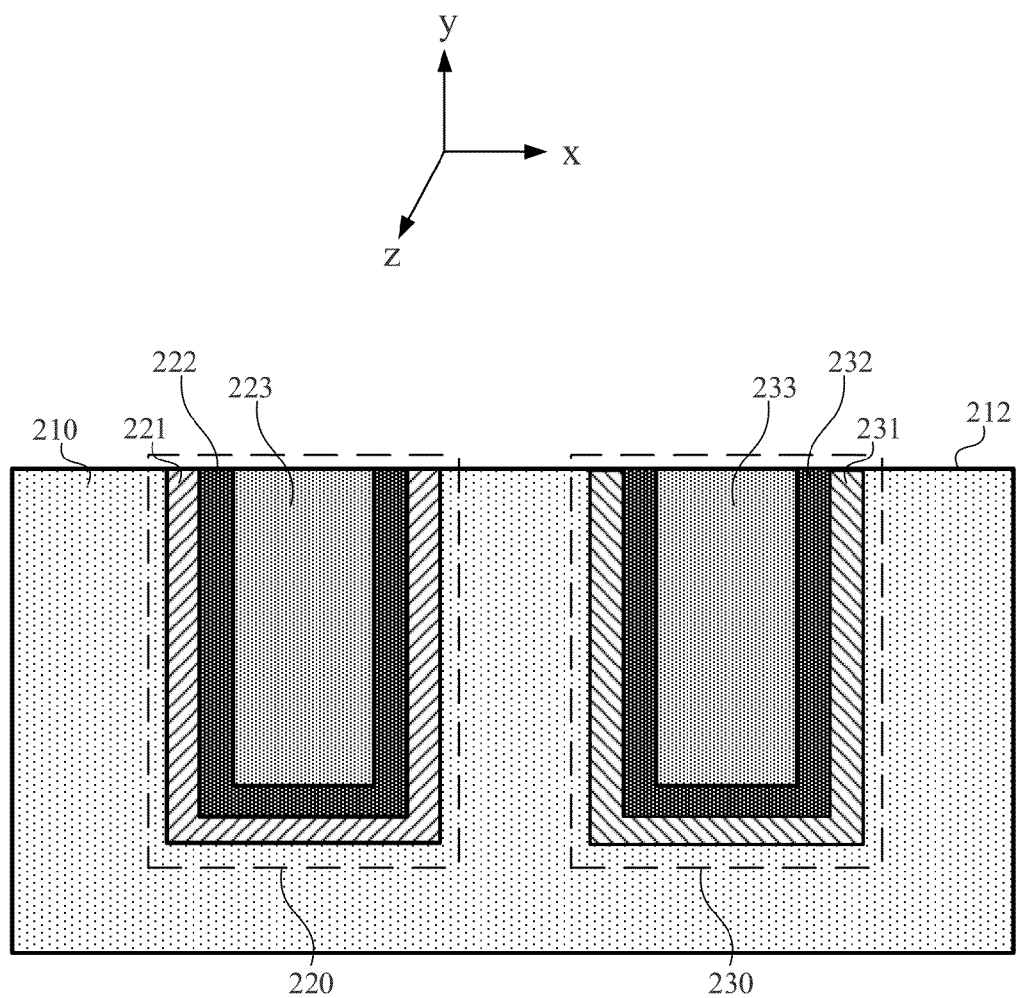

FIGS. 7 to 13 illustrate the manufacturing sequences of implementing the =200 of the present invention. First, a trough structure 220 is formed by etching the substrate 210, and a doping layer 221 is formed on the sidewall 710 and the bottom surface 740 of the trough structure 220 by ion implantation. Alternatively, the bottom surface 740 can be covered by photoresist before ion implantation so that the doping layer 221 is formed on the sidewall 710 only. A photoresist 720 is then formed on the doping layer 221 and the upper surface 212 of the substrate 210 and an opening 730 is created to expose a part of the upper surface 212 (as illustrated in FIG. 7). An etching process is then performed to the substrate 210 through the opening 730 to form a trough structure 230 (as illustrated in FIG. 8), and then a doping layer 231 is formed by ion implantation on the sidewall 810 and the bottom surface 820 of the trough structure 230 (as illustrated in FIG. 9). Alternatively, the doping layer 231 can be formed on the sidewall 810 only by covering the bottom surface 820 with photoresist before the above ion implantation process. After the photoresist 720 is removed (as illustrated in FIG. 10), an insulation layer 1110 is formed on the upper surface 212 of the substrate 210, the doping layer 221 and the doping layer 231 (as illustrated in FIG. 11). A conductive layer 1210 is then formed on the insulation layer 1110 (as illustrated in FIG. 12). Parts of the insulation layer 1110 and the conductive layer 1210 that are on the upper surface 212 are removed by chemical-mechanical polishing (CMP) (as illustrated in FIG. 13), and finally the semiconductor device 200 shown in FIG. 2 is completed by implementing a contact 224, a contact 225, a contact 234, and a contact 235. As shown in FIG. 13, in the trough structure 220, the doping layer 221, the insulation layer 222, and the conductive layer 223 are substantially parallel to the sidewall of the trough structure 220 and arranged in order from the sidewall to the center of the trough structure 220. Similarly, in the trough structure 230, the doping layer 231, the insulation layer 232, and the conductive layer 233 are substantially parallel to the sidewall of the trough structure 230 and arranged in order from the sidewall to the center of the trough structure 230.

The manufacturing sequences of implementing the semiconductor device 500 are similar to those shown in FIGS. 7 to 13; however the differences are that a doping layer 520 with higher doping concentration is made on the substrate 210 before the trough structure 220 and the doping layer 221 in FIG. 7 are made, and the step of forming the doping layer 231 in FIG. 9 is skipped. Moreover, the manufacturing sequences of implementing the semiconductor device 600 are similar to those shown in FIGS. 7 to 13; however the difference is that the step of forming the doping layer 231 in FIG. 9 is skipped.

Figure 14:
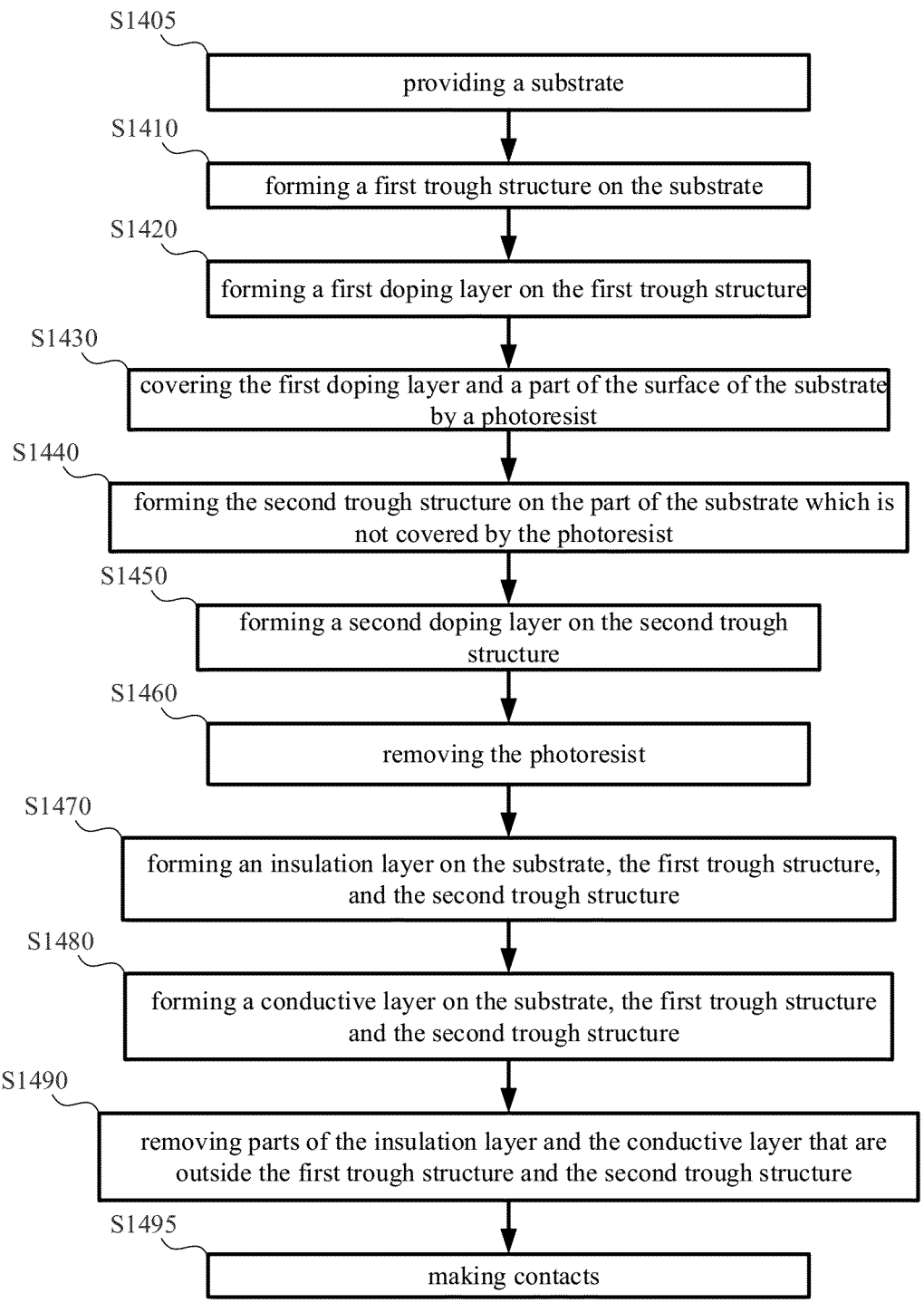
FIG. 14 illustrates a flowchart of manufacturing a semiconductor device according to an embodiment of the present invention.

Please refer to FIG. 14, illustrating a flowchart of manufacturing a semiconductor device according to an embodiment of the present invention. In addition to the aforementioned semiconductor device, a corresponding method of manufacturing a semiconductor device is also disclosed in this invention. The semiconductor device made by this method occupies smaller substrate area. As shown in FIG. 14, according to an embodiment of the present invention, the method of manufacturing a semiconductor device comprises the following steps:

Step S1405: providing a substrate. The substrate is either a p-substrate or an n-substrate. In making the semiconductor device 500, this step further comprises forming a doping layer with higher doping concentration on the substrate, for example, forming a p+ doping layer on a p-substrate;

Step S1410: forming a first trough structure on the substrate. Photo mask and etching technology are used in this step to etch the substrate, from the surface to the bottom, to form the first trough structure. Please note that the etching process does not penetrate through the substrate, and the first trough structure can be a trench structure or a part of a trough structure array;

Step S1420: forming a first doping layer on the first trough structure. The first trough structure comprises at least a sidewall and a bottom surface. The first doping layer is formed at least on the sidewall, and can be selectively formed on the bottom surface. The first doping layer forms a well structure. The doping type of the first doping layer can be the same as or different from that of the substrate. In the embodiment of the semiconductor device 500, the doping type of the doping layer 221 is different from the doping type of the substrate 510 and the doping layer 520, which has a higher doping concentration than the substrate 510. In the embodiment of the semiconductor device 600, the doping type of the doping layer 221 is different from the doping type of the substrate 610. In the embodiment of the semiconductor device 200, however, the doping type of the doping layer 221 can be the same as or different from the doping type of the substrate 210;

Step S1430: covering the first doping layer and a part of the surface of the substrate by a photoresist. A second trough structure will be formed on the substrate in the next step, so its area and position are defined by the photoresist in this step;

Step S1440: forming the second trough structure on the part of the substrate which is not covered by the photoresist. The substrate is etched, based on the pattern of the photoresist, to form another space to be the second trough structure;

Step S1450: forming a second doping layer on the second trough structure. The second trough structure comprises at least a sidewall and a bottom surface. The second doping layer is formed at least on the sidewall and can be selectively formed on the bottom surface. The second doping layer forms a well structure. In the embodiments of the semiconductor device 500 and the semiconductor device 600, this step is not required. However, in the embodiment of the semiconductor device 200, one implementation method is to make the doping type of the doping layer 231 the same as the doping type of the 210 but different from the doping type of the doping layer 221, and the resulting semiconductor device can be used as the ESD protection circuit 310 of FIG. 3; another implementation method is to make the doping type of the doping layer 231 the same as the doping types of the substrate 210 and the doping layer 221, and the resulting semiconductor device can be used as the ESD protection circuit 410 of FIG. 4;

Step S1460: removing the photoresist;

Step S1470: forming an insulation layer on the substrate, the first trough structure, and the second trough structure. In one embodiment, the insulation layer is made of oxides that are common in a semiconductor manufacturing process, such as silicon dioxide (SiO2), silicon nitride (Si3N4), or oxynitride. The insulation layer can be regarded as a first insulation layer in the first trough structure and a second insulation layer in the second trough structure. The first insulation layer covers the first doping layer. If the second doping layer is formed in the step S1450, the second insulation layer covers the second doping layer, e.g., the embodiment of the semiconductor device 200; otherwise the second insulation layer covers the sidewall and/or the bottom surface of the second trough structure, e.g., the embodiments of the semiconductor device 500 and the semiconductor device 600;

Step S1480: forming a conductive layer on the substrate, the first trough structure and the second trough structure. The conductive layer is made from metal such as, but not limited to, copper, tungsten, aluminum, aluminum-copper alloy, nickel, titanium nitride, and titanium. The conductive layer can be regarded as a first conductive layer in the first trough structure and a second conductive layer in the second trough structure. The first conductive layer covers the first insulation layer and the second conductive layer covers the second insulation layer.

Step S1490: removing parts of the insulation layer and the conductive layer that are outside the first trough structure and the second trough structure. When the steps S1470 and S1480 are completed, the appearance of the insulation layer and the conductive layer is shown as FIG. 12. To make contacts on the first doping layer and the second doping layer (if applicable), the insulation layer and the conductive layer on the surface of the substrate must be removed first, for example by using CMP, to expose the surface of the first doping layer at the opening of the first trough structure and/or the surface of the second doping layer at the opening of the second trough structure; and Step S1495: making contacts on the first doping layer, the second doping layer or the substrate. The completed semiconductor device is shown as FIG. 2, FIG. 5 or FIG. 6. The contacts on the doping layer or the substrate can be implemented by a via, a via array or a via trench.

Since people of ordinary skill in the art can appreciate the implementation detail and the modification thereto of the present method invention of FIG. 14 through the disclosure of the device invention of FIGS. 2 to 13, repeated and redundant description is thus omitted. Please note that there is no step sequence limitation for the method inventions as long as the execution of each step is applicable. Furthermore, the shape, size, and ratio of any element and the step sequence of any flow chart in the disclosed figures are just exemplary for understanding, not for limiting the scope of this invention. Besides, each aforementioned embodiment may include one or more features; however, this doesn't mean that one carrying out the present invention should make use of all the features of one embodiment at the same time, or should only carry out different embodiments separately. In other words, if an implementation derived from one or more of the embodiments is applicable, a person of ordinary skill in the art can selectively make use of some or all of the features in one embodiment or selectively make use of the combination of some or all features in several embodiments to have the implementation come true, so as to increase the flexibility of carrying out the present invention.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:
1. A semiconductor device, comprising:
   a substrate;
   a first trough structure on the substrate, comprising:
      a first conductive layer;

a first doping layer, a doping concentration of which is higher than a doping concentration of the substrate; and a first insulation layer, formed between the first conductive layer and the first doping layer;

a second trough structure on the substrate and separated from the first trough structure by a separation part of the substrate, comprising:

a second conductive layer;

a second doping layer, a doping concentration of which is higher than a doping concentration of the substrate; and a second insulation layer, formed between the second conductive layer and the second doping layer;

a first contact, connecting the first doping layer;

a second contact, connecting the second doping layer; and a third contact, connecting the second conductive layer;

wherein the separation part of the substrate forms a resistor, which is coupled between the first contact and the second contact, and the second doping layer, the second insulation layer and the second conductive layer together form a capacitor, which is coupled between the second contact and the third contact.

2. The semiconductor device of claim 1, wherein a doping type of the first doping layer is the same as a doping type of the substrate but is different from a doping type of the second doping layer.

3. The semiconductor device of claim 1, wherein the substrate, the first doping layer and the second doping layer have the same doping type.

4. The semiconductor device of claim 1 being applied to an ESD protection circuit, wherein the first contact is coupled to a first reference level, the second contact is coupled to a signal input terminal or a signal output terminal of a circuit, and the third contact is coupled to a second reference level, which is lower than the first reference level.

5. The semiconductor device of claim 4, further comprising a fourth contact, which connects the first conductive layer and is coupled to the first reference level.

6. The semiconductor device of claim 1, wherein a bottom surface of the first trough structure or the second trough structure is adjacent to the substrate.

7. A semiconductor device, comprising:

a substrate;

a first trough structure on the substrate, comprising:

a first conductive layer;

a first doping layer, a doping concentration of which is higher than a doping concentration of the substrate; and a first insulation layer, formed between the first conductive layer and the first doping layer;

a second trough structure on the substrate and separated from the first trough structure by a separation part of the substrate, comprising:

a second conductive layer; and a second insulation layer, formed between the second conductive layer and the substrate;

a first contact, connecting the first doping layer of the first trough structure;

a second contact, connecting the separation part of the substrate; and a third contact, connecting the second conductive layer of the second trough structure;

wherein the separation part of the substrate forms a resistor, which is coupled between the first contact and the second contact, and the substrate, the second insulation layer and the second conductive layer together form a capacitor, which is coupled between the second contact and the third contact.

8. The semiconductor device of claim 7, wherein a doping type of the substrate is different from a doping type of the first doping layer.

9. The semiconductor device of claim 7, wherein the substrate is pre-doped by a predetermined depth and the separation part comprises a part of the pre-doped area.

10. The semiconductor device of claim 9, wherein a doping type of the pre-doped area is the same as a doping type of the substrate but different from a doping type of the first doping layer.

11. The semiconductor device of claim 7 being applied to an ESD protection circuit, wherein the first contact is coupled to a first reference level, the second contact is coupled to signal input terminal or a signal output terminal of a circuit, and the third contact is coupled to a second reference level, which is lower than the first reference level.

12. The semiconductor device of claim 11 further comprising a fourth contact, which connects the first conductive layer and is coupled to the first reference level.

13. The semiconductor device of claim 7, wherein a bottom surface of the first trough structure or the second trough structure is adjacent to the substrate.

* * * * *